United States Patent [19]
Dobbelaere

[11] Patent Number: 5,399,921
[45] Date of Patent: Mar. 21, 1995

[54] DYNAMIC COMPLEMENTARY PASS-TRANSISTOR LOGIC CIRCUIT

[76] Inventor: Ivo J. Dobbelaere, P.O. Box 9801, Stanford, Calif. 94309

[21] Appl. No.: 166,625

[22] Filed: Dec. 14, 1993

[51] Int. Cl.[6] .......................................... H03K 19/017
[52] U.S. Cl. ...................................... 326/113; 326/21
[58] Field of Search ................. 307/443, 448, 451–453, 307/480–481

[56] References Cited

U.S. PATENT DOCUMENTS

| | | | |
|---|---|---|---|
| 4,569,032 | 2/1986 | Lee | 307/481 X |
| 4,570,084 | 7/1986 | Griffin | 307/452 |
| 4,692,637 | 9/1987 | Shoji | 307/443 |
| 4,700,086 | 10/1987 | Ling et al. | 307/443 |
| 4,710,650 | 12/1987 | Shoji | 307/452 |
| 4,841,174 | 6/1989 | Chung et al. | 307/452 X |
| 5,015,882 | 5/1991 | Houston et al. | 307/452 |
| 5,208,490 | 5/1993 | Yetter | 307/452 |

OTHER PUBLICATIONS

Yano, K. et al., "A 3.8-ns CMOS 16×16-b Multiplier . . . ", IEEE Journal of Solid-State Circuits, vol. 25, No. 2, Apr. 1990, pp. 388–395.
Krambeck, R. H. et al., "High-Speed Compact Circuits with CMOS", IEEE Journal of Solid State Circ., vol. SC-17, No. 3, Jun. 1982, pp. 614–619.
Glasser, L. A. and Dobber Puhl, D. W., "The Design and Analysis of VLSI Circuits", Addison–Wesley, 1985, p. 420, FIG. 8.5.
Childs, L. F.and Hirose, R. T., "An 18 ns 4K×4 CMOS SRAM", IEEE Journal of Solid–State Circuits, vol. SC-19, No. 5, Oct. 1984, p. 548, FIG. 8.
Suzuki, M. et al., "A 1.5 ns 32b CMOS Alu in Double Pass-Transistor Logic", IEEE Int. Solid-State Circ. Conf. Digest, Feb. 1993, pp. 90–91.
Partovi, H. et al., "A Regenerative Push-Pull Differential Logic Family", IEEE Int. Solid-State Cir. Conf. Digest, Feb. 1994, pp. 294–295.
Heikes, C., "A 4.5 mm² Multiplier Array for a 200 MFLOP Pipelined Coprocessor", IEEE Int. Solid-State Circ. Conf. Digest, Feb. 1994, pp. 290–291.
Hwang I. S. et al., "Ultrafast Compact 32-Bit CMOS Adders in Multiple-Output Domino Logic", IEEE Journ. Sol. State Circ., vol. 29, No. 2, Apr. 1989, pp. 358–369.

*Primary Examiner*—David R. Hudspeth

[57] ABSTRACT

A dynamic logic circuit style, which may be employed in fast logic circuits, is disclosed. The logic functionality is obtained using complementary pass transistor logic networks. Intermediate nodes and the complementary outputs are precharged to a high level during the precharge clock phase. During the evaluation clock phase, the inputs connected to gates of the pass transistors are constrained to either make a low-to-high transition or to maintain their initial low level; such signals are referred to as rising signals. The inputs connected to current electrodes of the pass transistors are constrained to either make a high-to-low transition or maintain their initial high level; such signals are referred to as falling signals. All signals are organized in pairs of true and complementary signals. In a falling signal pair, only one of the signals is allowed to make a high-to-low transition during an evaluation phase, while the other signal remains at the initial high level. In a rising signal pair, only one of the signals is allowed to make a low-to-high transition during an evaluation phase, while the other signal remains at the initial low level. This ensures that one of the true and complementary output nodes of the pass transistor networks makes a high-to-low transition, while the other node remains at a high level. The high-to-low transition is locally buffered by a clocked regenerative feedback circuit present on both output nodes. The signals on the output nodes form a pair of true and complementary signals which may be used as falling input signals for another circuit stage in the same circuit style. In the regenerative feedback circuits, the inverted output signals are produced and these signals form a pair of true and complementary rising signals which may be used as rising input signals for another circuit stage in the same circuit style.

5 Claims, 5 Drawing Sheets

DYNAMIC COMPLEMENTARY PASS-TRANSISTOR LOGIC CIRCUIT

CROSS REFERENCE TO RELATED APPLICATIONS

Co-pending U.S. patent application Ser. No. 142,900 entitled "DYNAMIC LOGIC INTERCONNECT SPEED-UP CIRCUIT" is incorporated herein by reference.

FIELD OF THE INVENTION

The present invention relates to integrated circuit technology, more specifically, to fast circuits for realizing logic functions.

BACKGROUND OF THE INVENTION

Pass transistor logic is a well known technique to implement complex gates in static logic with a small layout area and a small delay. In order to fully benefit from the higher driving capacitance of NMOS transistors, complementary pass transistor logic can be used. This technique is described in journal article "A 3.8-ns CMOS 16×16-b Multiplier Using Complementary Pass-Transistor Logic" by K. Yano et al., in the IEEE Journal of Solid State Circuits, Vol. 25, No. 2, April 1990, pp. 388–395. In this technique, complementary pass transistor logic networks are used to generate in parallel the true and the complement values of logic functions, while inverters are used for buffering the outputs between stages and for ensuring that the signal high level reaches positive supply voltage VDD. However, in this technique, low-to-high transitions through the pass transistor logic network are still in the critical path. Since only NMOS transistors are used in the pass transistor networks, low-to-high transitions propagate slowly through the pass transistor network to the inverter inputs. Moreover, the signal at the inverter input does not reach the potential of the positive supply voltage VDD since the pull-up path contains NMOS transistors with their gates connected to VDD. In this configuration, an NMOS transistor can only pull up a node to (VDD-VTN), where VTN is the threshold voltage of the NMOS transistor. In order to obtain a fast pull-up, specially designed NMOS transistors should be used in the NMOS pass transistor networks, with a threshold voltage close to zero, while the buffering inverters are designed to have a low trip point. Conference article "A 1.5 ns 32b CMOS ALU in Double Pass-Transistor Logic" by M. Suzuki et al., in the IEEE International Solid State Circuits Conference Digest of Technical Papers, February 1993, pp. 90–91, describes how PMOS and NMOS transistors can be used together to obtain a complementary logic network that maintains a high signal level of VDD without requiring buffering, and without requiring specially designed NMOS transistors. However, in this circuit PMOS transistors are reintroduced in the critical path.

It is well known that complex logic functions can be implemented with shorter latency and smaller layout area by using dynamic logic rather than static logic. A well known technique is DOMINO CMOS, described in journal article "High-Speed Compact Circuits with CMOS" by R. Krambeck et al., in the IEEE Journal of Solid State Circuits, Vol. SC-17, No. 3, June 1982, pp. 614–619. This technique employs clocked PMOS transistors for precharging, an NMOS pull-down network having signal inputs and a clock input for discharging, and an inverter for buffering and inverting the output signal. Due to the inversion of the output signal, it is possible to feed the output of such a DOMINO circuit to the input of another DOMINO circuit, and multiple logic levels can be connected for computation during the same evaluation clock phase. DOMINO circuits only use NMOS transistors in their evaluation network, and therefore their layout area and their delay are small. DOMINO logic allows only the implementation of non-inverting logic: only gates that can be reduced to a combination of AND and OR functions can be implemented. In order to generate inverting functions, complementary DOMINO logic must be used. An advantage of DOMINO logic is that it can be used to implement multiple levels of logic during a single evaluation clock phase very quickly, while still maintaining an acceptable noise immunity on intermediate nodes. This is partly due to the use of inverters between logic stages. It is the inverter trip point that determines the noise margin, and not the threshold voltage of individual transistors.

It is known that certain dynamic logic functions such as a carry chain or the bidirectional signal propagation through a path of programmable passive switches can be reliably implemented with a small propagation delay and a small layout area using regenerative feedback circuits or evaluation speed-up circuits at intermediate nodes. The Design and Analysis of VLSI Circuits (L. Glasser and D. Dobberpuhl, Addison-Wesley Publishing Company, Reading, MA, 1985, p. 420, FIG. 8.5) shows a carry chain employing a precharge PMOS transistor and an evaluation circuit with feedback on each intermediate node of the carry chain. Co-pending U.S. patent application Ser. No. 142,900 entitled "DYNAMIC LOGIC INTERCONNECT SPEED-UP CIRCUIT" shows a programmable interconnect architecture employing a precharge PMOS transistor and an evaluation circuit with feedback on intermediate nodes of the interconnect architecture. Such dynamic logic regenerative feedback circuits can be designed to have a good noise immunity on intermediate nodes by letting the node potential at which the feedback loop is turned on be determined by the gate threshold voltage of a logic gate. Also, output signals from a circuit that uses regenerative feedback may be used as the input signals to certain inputs of another circuit that uses regenerative feedback, for computation during the same evaluation clock period.

OBJECTS OF THE INVENTION

From the foregoing, it can be seen that the need exists for a dynamic logic circuit, that uses complementary pass transistor logic networks to generate the logic functionality, that employs only NMOS transistors in the pass transistor networks, that does not require the propagation of a low-to-high transition through the pass transistor networks, that generates buffered outputs with a high level of VDD and a low level of the ground potential GND while having only a small buffer propagation delay, that generates outputs that can be fed as inputs to other circuit stages in the same circuit style, similar to DOMINO logic or similar to dynamic regenerative feedback circuitry, and that ensures an acceptable noise immunity similar to DOMINO logic or similar to regenerative feedback circuitry.

Other objects and features of the invention will become apparent to those skilled in the art in light of the following description and drawings of the preferred embodiment.

BRIEF DESCRIPTION OF THE INVENTION

In accordance with the present invention, a dynamic complementary pass-transistor logic circuit for the implementation of logic functions is disclosed.

The circuit employs dynamic logic using a precharge and an evaluation clock phase. The signals are organized in pairs of true and complementary signals.

Complementary pass-transistor networks, employing NMOS transistors, are used to realize the true and complement version of the desired logic function of the complementary input signal pairs. Clocked PMOS transistors arc used to precharge internal nodes and the two complementary outputs, by providing a connection to the high supply voltage.

A rising signal pair is defined as a pair of signals in which one of the signals makes exactly one low-to-high transition during the evaluation clock phase while the other signal maintains a low level. During the precharge clock phase, both signals in a rising signal pair are forced to a low level. Each signal in a rising signal pair is individually referred to as a rising signal.

A falling signal pair is defined as a complementary pair of signals in which one of the signals makes exactly one high-to-low transition during the evaluation clock phase while the other signal maintains a high level. During the precharge clock phase, both signals in a falling signal pair are forced to a high level. Each signal in a falling signal pair is individually referred to as a falling signal.

At the inputs connected to the gates of the NMOS transistors in the complementary pass-transistor network, rising signal pairs are provided. At the inputs connected to current electrodes of the NMOS transistors in the complementary pass-transistor network, falling signal pairs are provided. This ensures that during the evaluation clock phase, exactly one of the true and complementary outputs to the precharged complementary pass transistor network is discharged while the other maintains its high logic level from precharging through capacitive storage.

At both outputs to the complementary pass-transistor networks, evaluation speed-up circuits, also referred to as regenerative feedback circuits, are present. These evaluation speed-up circuits accelerate the discharging of the falling one of the output nodes during the evaluation clock phase, once the node level is below a predetermined gate threshold voltage. Thus, the outputs of the complementary pass-transistor network form a buffered falling signal pair, which may be fed as signals to another circuit stage of the same circuit style, to the inputs that require a falling signal pair. These outputs are referred to as the falling output pair.

In one embodiment, the evaluation speed-up circuit consists of an inverter having its input connected to the falling output node. This inverter drives an NMOS pull-down transistor that is placed in series with a clocked NMOS pull-down transistor, between the falling output node and ground. If during the evaluation clock phase the falling output node falls below the inverter trip point, the inverter output goes to a high level, thus turning on the NMOS pull-down transistor. Since during the evaluation clock phase, the clocked NMOS pull-down is turned on as well, a pull-down path appears between the falling output node and ground.

The outputs of the inverters from the evaluation speed-up circuits at true and complementary falling output nodes are used as complementary and true rising output nodes, referred to as the rising output pair. These rising output signals may be directly fed as signals to another circuit stage in the same circuit style, to the inputs that require a rising signal pair.

In another embodiment, the evaluation speed-up circuit consists of a two-input logic NOR gate having one input connected to the falling output node and one input connected to the inverted clock. This logic NOR gate drives an NMOS pull-down transistor that is placed between the falling output node and ground.

During the evaluation clock phase, a low logic level is present on the inverted clock. Hence, if during the evaluation clock phase the falling output node falls below the gate threshold voltage of the logic NOR gate, its output goes to a high level, thus turning on the NMOS pull-down transistor. A pull-down path appears between the falling output node and ground. In this embodiment, the outputs of the logic NOR gates from the evaluation speed-up circuits are now used as complementary and true rising output nodes, referred to as the rising output pair. These rising output signals may be directly fed as signals to another circuit stage in the same circuit style, to the inputs that require a rising signal pair.

Hence, a circuit style is obtained that uses complementary signal pairs with well defined transition contraints during an evaluation clock phase such that outputs may be fed to inputs of circuits in the same circuit style for computation during the same evaluation clock phase. The falling and rising signals on the nodes between circuit stages are buffered but with only a small increase in the propagation delay. Since dynamic logic is used, the complementary pass-transistor networks only need to propagate a high-to-low transition from one of its falling inputs to the falling output nodes, which is fast, does not cause a signal voltage drop, and hence makes full use of the NMOS pass transistor driving capability while avoiding the traditional drawbacks of using NMOS pass transistor networks. A good noise margin is guaranteed due to the elimination of a low-to-high transition propagation through the NMOS pass transistor network, thus avoiding voltage drop, and also because it is the gate threshold voltage of inverters or logic NOR gates in the evaluation speed-up circuits that determines when a buffer becomes active, rather than a transistor threshold voltage. A fast, reliable circuit technique for multi-level logic is obtained which does not require pass transistors with specially designed threshold voltages.

BRIEF DESCRIPTION OF THE DRAWINGS

FIGS. 1a through 1h show illustrative embodiments of precharged complementary combinatorial pass transistor networks and their symbol.

FIG. 1b shows the symbol for the 2-to-1 multiplexer of FIG. 1a.

DETAILED DESCRIPTION OF SPECIFIC EMBODIMENTS

Throughout this description, the same labels have been used for like elements.

It is necessary to explain the implementation of logic functions using complementary pass-transistor logic networks consisting of NMOS transistors. Journal article "A 3.8-ns CMOS 16×16-b Multiplier Using Complementary Pass-Transistor Logic" by K. Yano et al., in the IEEE Journal of Solid State Circuits, Vol. 25, No. 2, April 1990, pp. 388–395, is incorporated herein by reference.

In this discussion, the terms "NMOS transistor" and "PMOS transistor" refer to n-channel and p-channel metal-oxide-semiconductor field effect transistors, respectively. NMOS and PMOS transistors are used in this explanation because they are widely used. It is clear that any n-channel and p-channel field effect transistors, and in general any switching device with substantially similar characteristics, can be used.

It is also necessary to explain the implementation of dynamic regenerative logic circuits, also called evaluation speed-up circuits. Such circuits are described in detail in the mentioned U.S. patent application Ser. No. 142,900, incorporated herein.

For clarity in the explanation, a number of frequently used terms are defined as follows.

The term "logic" is used to refer to Boolean logic.

A "precharge clock phase" is defined as the period of time during which certain circuit nodes; to be defined later, are precharged to a predetermined logic level. In the discussion that follows, PMOS transistors with their gates connected to a clock or system clock CLK are used to obtain precharging to a high logic level. Therefore, in this discussion, a low level is present on clock CLK during a precharge clock phase.

An "evaluation clock phase" is defined as the period of time during which logic computations are performed, which may lead to a change in logic level on some of the precharged circuit nodes. In this discussion, a high level is present on clock CLK during an evaluation clock phase.

A "falling signal" is defined as a signal that is forced to a high logic level during a precharge clock phase, and that either makes exactly one high-to-low transition or maintains a high logic level during an evaluation clock phase.

A "falling signal pair", for example AF and ANF, is defined as a true falling signal AF and a complementary falling signal ANF derived from a single equivalent static signal A in the following manner. If equivalent static signal A is at a high logic level at the beginning of a particular evaluation clock phase, or upon completion of the computation during a particular evaluation clock phase, true falling signal AF remains at a high logic level during the evaluation clock phase, while complementary falling signal ANF, which is initially at a high logic level during the evaluation clock phase, makes a high-to-low transition and stays at a low logic level during the remainder of this evaluation clock phase. Complementarily, if equivalent static signal A is at a low logic level at the beginning of a particular evaluation clock phase, or upon completion of the computation during a particular evaluation clock phase, true falling signal AF, which is initially at a high logic level during this evaluation clock phase, makes a high-to-low transition and stays at a low logic level during the remainder of this evaluation clock phase, while complementary falling signal ANF remains at a high logic level during this evaluation clock phase. During a precharge clock phase, both true and complementary falling signals AF and ANF are forced to a high logic level.

Similarly, a "falling input", "falling node" and "falling output" are defined as a circuit input, a circuit node, and a circuit output, respectively, on which a "falling signal" is present; and a "falling input pair", a "falling node pair" and a "falling output pair" are defined as a pair of circuit inputs, circuit nodes, and circuit outputs, respectively, on which a "falling signal pair" is present.

If a true and complementary "falling signal pair" YF and YNF is present on a pair of circuits nodes, a single equivalent static signal Y may be determined as follows. At the moment when true falling signal YF makes a high-to-low transition during the evaluation clock phase, equivalent static signal Y has a low logic level. At the moment, when complementary falling signal YNF makes a high-to-low transition during the evaluation clock phase, equivalent static signal Y has a high logic level. As long as both true and complementary falling signals YF and YNF remain at a high logic level, the new equivalent static signal Y has yet not been computed for the current evaluation clock phase, and the equivalent static signal Y that was determined by the end of the previous evaluation clock phase may be used to represent falling signal pair YF and YNF until a new equivalent static signal Y has been computed.

Similarly, a "rising signal" is defined as a signal that is forced to a low logic level during a precharge clock phase, and that either makes exactly one low-to-high transition or maintains a low logic level during an evaluation clock phase.

A "rising signal pair", for example AR and ANR, is defined as a true rising signal AR and a complementary rising signal ANR derived from single equivalent static signal A in the following manner. If equivalent static signal A is at a high logic level at the beginning of a particular evaluation clock phase, or upon completion of the computation during a particular evaluation clock phase, true rising signal AR remains at a low logic level during the evaluation clock phase, while complementary rising signal ANR, which is initially at a low logic level during the evaluation clock phase, makes a low-to-high transition and stays at a high logic level during the remainder of this evaluation clock phase. Complementarily, if equivalent static signal A is at a low logic level at the beginning of a particular evaluation clock phase, or upon completion of the computation during a particular evaluation clock phase, true rising signal AR, which is initially at a low logic level during this evaluation clock phase, makes a low-to-high transition and stays at a high logic level during the remainder of this evaluation clock phase, while complementary rising signal ANR remains at a low logic level during this evaluation clock phase. During a precharge clock phase, both true and complementary rising signals AR and ANR are forced to a low logic level.

Similarly, a "rising input", a "rising node" and a "rising output" are defined as a circuit input, a circuit node, and a circuit output, respectively, on which a "rising signal" is present; and a "rising input pair", a "rising node pair" and a "rising output pair" are defined as a pair of circuit inputs, circuit nodes, and circuit outputs, respectively, on which a "rising signal pair" is present.

If a true and complementary "rising signal pair" YR and YNR is present on a pair of circuits nodes, a single equivalent static signal Y may be determined as follows. At the moment when true rising signal YR makes a low-to-high transition during the evaluation clock phase, equivalent static signal Y has a high logic level. At the moment when complementary rising signal YNF makes a low-to-high transition during the evaluation clock phase, equivalent static signal Y has a low logic level. As long as both true and complementary rising signals YR and YNR maintain a low logic level, the new equivalent static signal Y has not been computed for the current evaluation clock phase, and the equivalent static signal Y that was determined by the end of the previous evaluation clock phase may be used to represent rising signal pair YR and YNR until a new equivalent static signal Y has been computed.

FIGS. 1a through 1h show examples of precharged complementary pass transistor logic networks and their symbols.

Figure 1A:
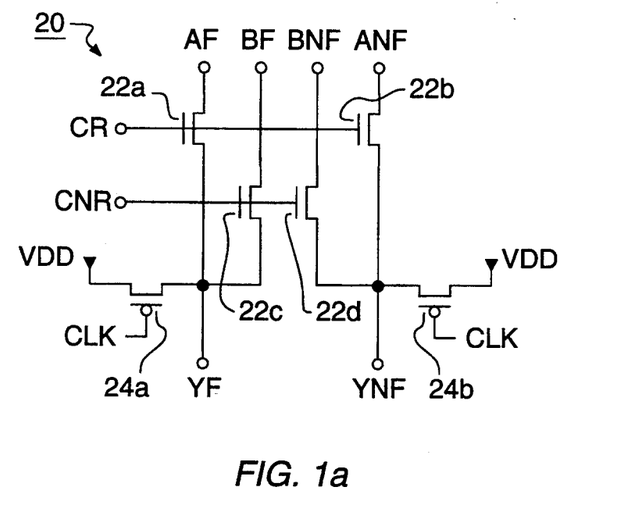
FIG. 1a shows the schematic for a 2-to-1 multiplexer.

FIG. 1a depicts an embodiment 20 of a precharged complementary pass transistor logic network for a 2-to-1 multiplexer gate.

Embodiment 20 of FIG. 1a includes four NMOS pass transistors 22a through 22d, two clocked PMOS precharge transistors 24a and 24b, four falling inputs AF, BF, ANF and BNF, two rising inputs CR and CNR, two falling outputs YF and YNF, a clock CLK and a positive supply voltage VDD.

NMOS pass transistor 22a has its gate connected to rising input CR, has a first current electrode connected to falling input AF, and has a second current electrode connected to falling output YF. NMOS pass transistor 22b has its gate connected to rising input CR, has a first current electrode connected to falling input ANF, and has a second current electrode connected to falling output YNF. NMOS pass transistor 22c has its gate connected to rising input CNR, has a first current electrode connected to falling input BF, and has a second current electrode connected to falling output YF. NMOS pass transistor 22d has its gate connected to rising input CNR, has a first current electrode connected to falling input BNF, and has a second current electrode connected to falling output YNF. PMOS precharge transistor 24a has its gate connected to clock CLK, has a first current electrode connected to positive supply voltage VDD, and has a second current electrode connected to falling output node YF. PMOS precharge transistor 24b has its gate connected to clock CLK, has a first current electrode connected to positive supply voltage VDD, and has a second current electrode connected to falling output node YNF.

The operation of embodiment 20 in FIG. 1a is as follows. Inputs AF and ANF are a falling signal pair derived from an equivalent static signal A. AF is the true falling signal and ANF is the complementary falling signal. Inputs BF and BNF are a falling signal pair derived from an equivalent static signal B. BF is the true falling signal and BNF is the complementary falling signal. Inputs CR and CNR are a rising signal pair derived from an equivalent static signal C. CR is the true rising signal and CNR is the complementary rising signal.

During a precharge clock phase, clock CLK is at a low level, and both PMOS transistors 24a and 24b are turned on, connecting both falling output nodes YF and YNF to the high level. Also during a precharge clock phase, rising inputs CR and CNR are both forced to a low level by circuits external to embodiment 20, conform with the definition of rising inputs. Therefore, the four NMOS transistors 22a through 22d are turned OFF. Also during a precharge clock phase, falling input signals AF, ANF, BF and BNF are forced to a high level by circuits external to embodiment 20, conform with the definition of falling inputs.

During an evaluation clock phase, clock CLK is at a high level, and both PMOS transistors 24a and 24b are turned off. Since rising inputs CR and CNR are true and complementary rising signals derived from equivalent static signal C, either rising input CR or CNR makes a low-to-high transition during an evaluation clock phase, while the other rising input remains at a low logic level.

If equivalent static signal C is high, then rising input CR makes a low-to-high transition, and both NMOS transistors 22a and 22b are turned on; while rising input CNR remains low and both NMOS transistors 22c and 22d remain turned off. Since falling inputs AF and ANF are true and complementary falling signals derived from equivalent static signal A, either falling input AF or ANF makes a high-to-low transition during an evaluation clock phase, while the other falling input remains at a high logic level. Hence, since NMOS transistors 22a and 22b are turned on, the levels appearing on falling inputs AF and ANF are propagated onto falling outputs YF and YNF. If equivalent static signal A is high, then falling input AF remains at a high logic level while falling input ANF makes a high-to-low transition. Hence, falling output YF remains at a high logic level while falling output YNF makes a high-to-low transition. If equivalent static signal A is low, then falling input ANF remains at a high logic level while falling input AF makes a high-to-low transition. Hence, falling output YNF remains at a high logic level while falling output YF makes a high-to-low transition.

If equivalent static signal C is low, then rising input CNR makes a low-to-high transition, and both NMOS transistors 22c and 22d are turned on; while rising input CR remains low and both NMOS transistors 22a and 22b remain turned off. Since falling inputs BF and BNF are true and complementary falling signals derived from equivalent static signal B, either falling input BF or BNF makes a high-to-low transition during an evaluation clock phase, while the other falling input remains at a high logic level. Hence, since NMOS transistors 22c and 22d are turned on, the levels appearing on falling inputs BF and BNF are propagated onto falling outputs YF and YNF. If equivalent static signal B is high, then falling input BF remains at a high logic level while falling input BNF makes a high-to-low transition. Hence, falling output YF remains at a high logic level while falling output YNF makes a high-to-low transition. If equivalent signal B is low, then falling input BNF remains at a high logic level while falling input BF makes a high-to-low transition. Hence, falling output YNF remains at a high logic level while falling output YF makes a high-to-low transition.

As explained earlier, a single equivalent static signal Y can be determined from falling output pair YF and YNF. It is clear from the above explanations that when equivalent static signal C is high, the same levels appear on falling outputs YF and YNF as appear on falling inputs AF and ANF. When equivalent static signal C is low, the same levels appear on falling outputs YF and YNF as appear on falling inputs BF and BNF. Hence, when equivalent static signal C is high, falling outputs YF and YNF represent an equivalent static signal Y that is a delayed version of equivalent static signal A. When equivalent static signal C is low, falling outputs YF and YNF represent an equivalent static signal Y that is a delayed version of equivalent static signal B. This may be viewed as a 2-to-1 multiplexer.

The logic formula describing the function of embodiment 20 of FIG. 1a is as follows:

$$Y = C.A + C'.B \qquad \text{Eq. 1}$$

Here, "." symbolizes a logic OR operation, "+" symbolizes a logic AND operation, and a superscript prime (') symbolizes a logic inversion of its argument. This may be explicitly written as:

$$Y = (C \text{ ANY } A) \text{OR}((\text{NOT } C) \text{ AND } B) \qquad \text{Eq. 2}$$

Figure 1B:
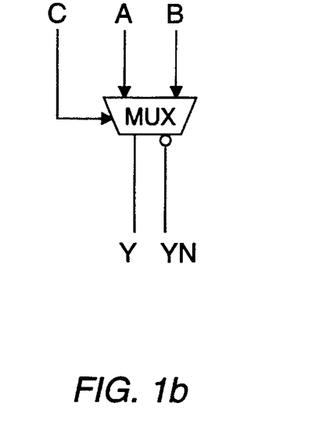

FIG. 1b shows the symbol of a 2-to-1 multiplexer for embodiment 20 of FIG. 1a. In FIG. 1b, equivalent static signals are used. Equivalent static signals A and B are the multiplexer data inputs and equivalent static signal C is the multiplexer selection input. Equivalent static signal Y is the multiplexer output.

Now referring back to FIG. 1a, a logically inverted output is readily available as falling output pair YNF and YF, where falling output YNF is regarded as the true falling output and falling output YF is regarded as the complementary falling output. An equivalent static signal YN is derived as the logic inversion of output Y, from true and complementary falling output pair YNF and YF. Equivalent static signal YN is shown symbolically in FIG. 1b.

Now referring back to FIG. 1a, it is clear to those of ordinary skill in the art that an inversion of an equivalent static input signal may be obtained by simply exchanging true and complementary falling inputs or by exchanging true and complementary rising inputs.

In general, other embodiments of precharged complementary pass transistor networks may be derived from embodiment 20 in FIG. 1a by performing one of the following transformations. Within a falling input pair, true and complementary falling inputs may be exchanged in order to obtain an inverted falling input pair. Within a rising input pair, true and complementary rising inputs may be exchanged in order to obtain an inverted rising input pair. Within a falling output pair, true and complementary falling outputs may be exchanged in order to obtain an inverted falling output pair. Some of the true and complementary falling input signals may be derived from the same equivalent static signal that was used to derive the true and complementary rising input signals. Some of the true and complementary falling input signals may be derived from the inverse of the equivalent static signal that was used to derive the true and complementary rising input signals.

FIGS. 1c through 1h shows embodiments and their symbols for precharged complementary pass transistor networks that were obtained by using the above transformations on embodiment 20 of FIG. 1a.

Figure 1C:
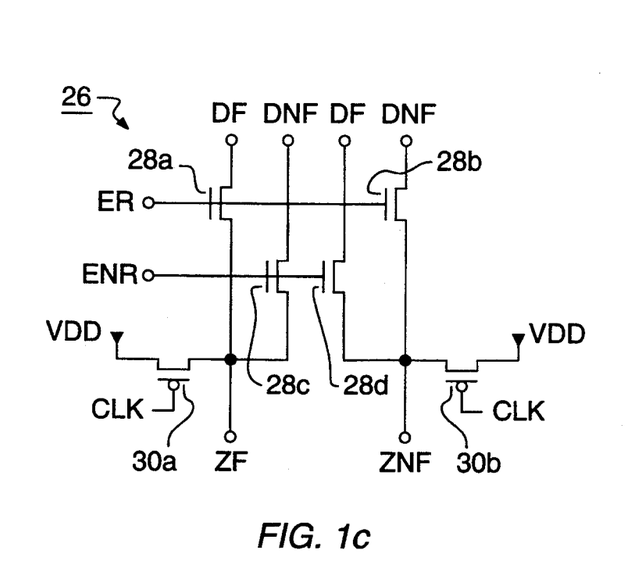
FIG. 1c shows the schematic for a two-input logic NEXOR gate.

FIG. 1c depicts an embodiment 26 of a precharged complementary pass transistor logic network for a two-input NEXOR gate.

Embodiment 26 of FIG. 1c includes four NMOS pass transistors 28a through 28d, two clocked PMOS precharge transistors 30a and 30b, two falling inputs DF, DNF, two rising inputs ER and ENR, two falling outputs ZF and ZNF, a clock CLK and a positive supply voltage VDD. It should be noted that the difference between embodiment 26 of FIG. 1c and embodiment 20 of FIG. 1a is only in the input signals.

NMOS pass transistor 28a has its gate connected to rising input ER, has a first current electrode connected to falling input DF, and has a second current electrode connected to falling output ZF. NMOS pass transistor 28b has its gate connected to rising input E11, has a first current electrode connected to falling input DNF, and has a second current electrode connected to falling output ZNF. NMOS pass transistor 28c has its gate connected to rising input ENR, has a first current electrode connected to falling input DNF, and has a second current electrode connected to falling output ZF. NMOS pass transistor 28d has its gate connected to rising input ENR, has a first current electrode connected to falling input DF, and has a second current electrode connected to falling output ZNF. PMOS precharge transistor 30a has its gate connected to clock CLK, has a first current electrode connected to positive supply voltage VDD, and has a second current electrode connected to falling output node ZF. PMOS precharge transistor 30b has its gate connected to clock CLK, has a first current electrode Connected to positive supply voltage VDD, and has a second current electrode connected to falling output node ZNF.

With respect to embodiment 20 of FIG. 1a, embodiment 26 of FIG. 1c has different inputs derived from different equivalent static signals. In view of the explanation of the operation of embodiment 20 of FIG. 1a, it is clear that the operation of embodiment 26 of FIG. 1c is similar to the operation of embodiment 20 of FIG. 1a. By simply substituting the equivalent static signals used in embodiment 26 of FIG. 1c in the logic formula Eq. 1 that was derived for embodiment 20, the logic functionality of embodiment 26 of FIG. 1c may be readily derived.

Indeed, true and complementary rising signals CR and CNR derived from equivalent static signal C of embodiment 20 of FIG. 1a are replaced by true and complementary rising signals ER and ENR derived from an equivalent static signal E in embodiment 26 of FIG. 1c. True and complementary falling signals AF and ANF derived from an equivalent static signal A of embodiment 20 of FIG. 1a are replaced by true and complementary falling signals DF and DNF derived from equivalent static signal D in embodiment 26 of FIG. 1c. True and complementary falling signals BF and BNF derived from equivalent static signal B of embodiment 20 of FIG. 1a are replaced by true and complementary falling signals DNF and DF derived from equivalent static signal D in embodiment 26 of FIG. 1c. True and complementary falling outputs YF and YNF related to equivalent static signal Y of embodiment 20 of FIG. 1a are replaced by true and complementary rising signals ZF and ZNF related to equivalent static signal Z in embodiment 26 of FIG. 1c.

After substituting these changes in formula Eq. 1, the logic functionality for embodiment 26 of FIG. 1c may be derived as:

$$Z = E.D + E'.D' \qquad \text{Eq. 3}$$

Formula Eq. 3 represent the two-input NOT EXCLUSIVE OR function:

$$Z = E \text{ NEXOR } D \qquad \text{Eq. 4}$$

Hence, embodiment 26 of FIG. 1c implements a two-input logic NEXOR gate.

Figure 1D:
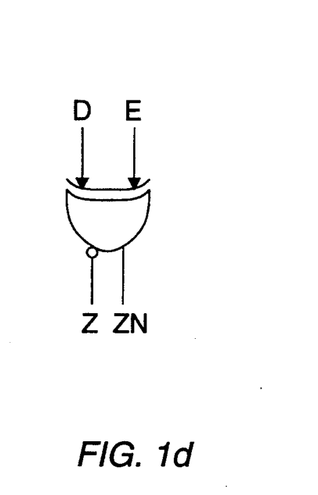
FIG. 1d shows the symbol for the two-input logic NEXOR gate of FIG. 1c.

FIG. 1d shows the symbol of a two-input logic NEXOR gate for embodiment 26 of FIG. 1c. In FIG. 1d, equivalent static signals are used. Now referring back to FIG. 1c, a logically inverted output is readily available as falling output pair ZNF and ZF, where falling output ZNF is regarded as the true falling output and falling output ZF is regarded as the complementary falling output. An equivalent static signal ZN is derived as the logic inversion of output Z, from true and complementary falling output pair ZNF and ZF. Equivalent static signal ZN is shown symbollically in FIG. 1d.

Figure 1E:
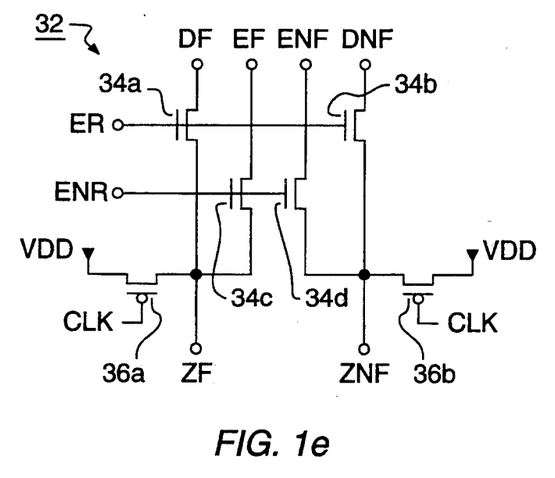
FIG. 1e shows the schematic for a two-input logic AND gate.

FIG. 1e depicts an embodiment 32 of a precharged complementary pass transistor logic network for a two-input AND gate.

Embodiment 32 of FIG. 1e includes four NMOS pass transistors 34a through 34d, two clocked PMOS precharge transistors 36a and 36b, four falling inputs DF, DNF, EF and ENF, true and complementary rising inputs ER and ENR, two falling outputs ZF and ZNF, a clock CLK and a positive supply voltage VDD. It should be noted that the difference between embodiment 32 of FIG. 1e and embodiment 20 of FIG. 1a is only in the input signals.

NMOS pass transistor 34a has its gate connected to rising input ER, has a first current electrode connected to falling input DF, and has a second current electrode connected to falling output ZF. NMOS pass transistor 34b has its gate connected to rising input ER, has a first current electrode connected to falling input DNF, and has a second current electrode connected to falling output ZNF. NMOS pass transistor 34c has its gate connected to rising input ENR, has a first current electrode connected to falling input EF, and has a second current electrode connected to falling output ZF. NMOS pass transistor 34d has its gate connected to rising input ENR, has a first current electrode connected to falling input ENF, and has a second current electrode connected to falling output ZNF. PMOS precharge transistor 36a has its gate connected to clock CLK, has a first current electrode connected to positive supply voltage VDD, and has a second current electrode connected to falling output node ZF. PMOS precharge transistor 36b has its gate connected to clock CLK, has a first current electrode connected to positive supply voltage VDD, and has a second current electrode connected to falling output node ZNF.

With respect to embodiment 20 of FIG. 1a, embodiment 32 of FIG. 1e has different inputs derived from different equivalent static signals. In view of the explanation of the operation of embodiment 20 of FIG. 1a, it is clear that the operation of embodiment 32 of FIG. 1e is similar to the operation of embodiment 20 of FIG. 1a.

By simply substituting the equivalent static signals used in embodiment 32 of FIG. 1e in the logic formula Eq. 1 that was derived for embodiment 20, the logic functionality of embodiment 32 of FIG. 1e may be readily derived.

Indeed, true and complementary rising signals CR and CNR derived from equivalent static signal C of embodiment 20 of FIG. 1a are replaced by true and complementary rising signals ER and ENR derived from equivalent static signal E in embodiment 32 of FIG. 1e. True and complementary falling signals AF and ANF derived from equivalent static signal A of embodiment 20 of FIG. 1a are replaced by true and complementary falling signals DF and DNF derived from equivalent static signal D in embodiment 32 of FIG. 1e. True and complementary falling signals BF and BNF derived from equivalent static signal B of embodiment 20 of FIG. 1a are replaced by true and complementary falling signals ENF and EF derived from equivalent static signal E in embodiment 32 of FIG. 1e. True and complementary falling outputs YF and YNF related to equivalent static signal Y of embodiment 20 of FIG. 1a are replaced by true and complementary rising signals ZF and ZNF related to equivalent static signal Z in embodiment 32 of FIG. 1e.

After substituting these changes in formula Eq. 1, the logic functionality for embodiment 32 of FIG. 1e may be derived as:

$$Z = E.D + E'.E \qquad \text{Eq.5}$$

Since E'.E = 0, this may be simplified to:

$$Z = E.D \qquad \text{Eq.6}$$

Formula Eq. 6 represents the two-input AND function:

$$Z = E \text{ AND } D \qquad \text{Eq.7}$$

Hence, embodiment 32 of FIG. 1e implements a two-input logic AND gate.

Figure 1F:
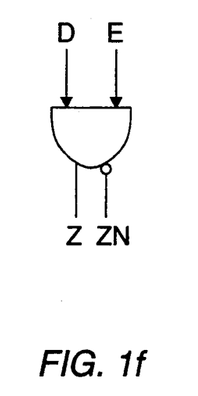
FIG. 1f shows the symbol for the two-input logic AND gate of FIG. 1e.

FIG. 1f shows the symbol of a two-input logic AND gate for embodiment 32 of FIG. 1e. In FIG. 1f, equivalent static signals are used. Now referring back to FIG. 1e, a logically inverted output is readily available as falling output pair ZNF and ZF, where falling output ZNF is regarded as the true falling output and falling output ZF is regarded as the complementary falling output. An equivalent static signal ZN is derived as the logic inversion of output Z, from true and complementary falling output pair ZNF and ZF. Equivalent static signal ZN is shown symbollically in FIG. 1f.

Figure 1G:
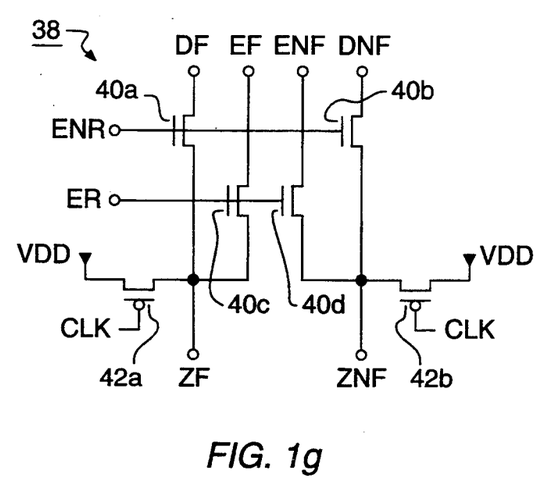
FIG. 1g shows the schematic for a two-input logic OR gate.

FIG. 1g depicts an embodiment 38 of a precharged complementary pass transistor logic network for a two-input OR gate.

Embodiment 38 of FIG. 1g includes four NMOS pass transistors 40a through 40d, two clocked PMOS precharge transistors 42a and 42b, four falling inputs DF, EF, DNF and ENF, two rising inputs ER and ENR, two falling outputs ZF and ZNF, a clock CLK and a positive supply voltage VDD. It should be noted that the difference between embodiment 38 of FIG. 1g and embodiment 20 of FIG. 1a is only in the input signals.

NMOS pass transistor 40a has its gate connected to rising input ENR, has a first current electrode connected to falling input DF, and has a second current electrode connected to falling output ZF. NMOS pass transistor 40b has its gate connected to rising input ENR, has a first current electrode connected to falling input DNF, and has a second current electrode connected to falling output ZNF. NMOS pass transistor 40c has its gate connected to rising input ER, has a first current electrode connected to falling input EF, and has a second current electrode connected to falling output ZF. NMOS pass transistor 40d has its gate connected to rising input ER, has a first current electrode connected to falling input ENF, and has a second current electrode connected to falling output ZNF. PMOS precharge transistor 42a has its gate connected to clock CLK, has a first current electrode connected to positive supply voltage VDD, and has a second current electrode connected to falling output node ZF. PMOS precharge transistor 42b has its gate connected to clock CLK, has a first current electrode connected to positive supply voltage VDD, and has a second current electrode connected to falling output node ZNF.

With respect to embodiment 20 of FIG. 1a, embodiment 38 of FIG. 1g has different inputs derived from different equivalent static signals. In view of the explanation of the operation of embodiment 20 of FIG. 1a, it is clear that the operation of embodiment 38 of FIG. 1g is similar to the operation of embodiment 20 of FIG. 1a. By simply substituting the equivalent static signals used in embodiment 38 of FIG. 1g in the logic formula Eq. 1 that was derived for embodiment 20, the logic functionality of embodiment 38 of FIG. 1g may be readily derived.

Indeed, true and complementary rising signals CR and CNR derived from equivalent static signal C of embodiment 20 of FIG. 1a are replaced by true and complementary rising signals ENR and ER derived from equivalent static signal E' in embodiment 38 of FIG. 1g. True and complementary falling signals AF and ANF derived from equivalent static signal A of embodiment 20 of FIG. 1a are replaced by true and complementary falling signals DF and DNF derived from equivalent static signal D in embodiment 38 of FIG. 1g. True and complementary falling signals BF and BNF derived from equivalent static signal B of embodiment 20 of FIG. 1a are replaced by true and complementary failing signals ENF and EF derived from equivalent static signal E in embodiment 38 of FIG. 1g. True and complementary falling outputs YF and YNF related to equivalent static signal Y of embodiment 20 of FIG. 1a are replaced by true and complementary rising signals ZF and ZNF related to equivalent static signal Z in embodiment 38 of FIG. 1g.

After substituting these changes in formula Eq. 1, the logic functionality for embodiment 38 of FIG. 1g may be derived as:

$$Z = E'.D + E.E \qquad \text{Eq. 8}$$

Since E.E=E=(E+E.D), this may be rewritten as:

$$Z = E'.D + E + E.D \qquad \text{Eq. 9}$$

And, since (E'.D+E.D)=D:

$$Z = D + E \qquad \text{Eq. 10}$$

Formula Eq. 9 represents the two-input OR function:

$$Z = E \text{ OR } D \qquad \text{Eq. 11}$$

Hence, embodiment 38 of FIG. 1f implements a two-input logic OR gate.

Figure 1H:
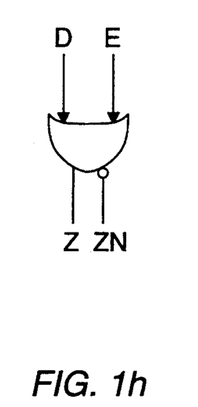
FIG. 1h shows the symbol for the two-input logic OR gate of FIG. 1g.

FIG. 1h shows the symbol of a two-input logic OR gate for embodiment 38 of FIG. 1g. In FIG. 1h, equivalent static signals are used. Now referring back to FIG. 1g, a logically inverted output is readily available as falling output pair ZNF and ZF, where falling output ZNF is regarded as the true falling output and falling output ZF is regarded as the complementary falling output. An equivalent static signal ZN is derived as the logic inversion of output Z, from true and complementary falling output pair ZNF and ZF. Equivalent static signal ZN is shown symbollically in FIG. 1h.

Embodiments 20, 26, 32, and 38 of FIGS. 1a, 1c, 1e and 1g, respectively, may be used as building blocks to make larger precharged complementary pass transistor logic networks. It is possible to derive many more precharged complementary pass transistor logic schemes. For precharged complementary pass transistor logic networks that have intermediate nodes, additional clocked PMOS precharge transistors are required to precharge these intermediate nodes to a high level.

Figure 2A:
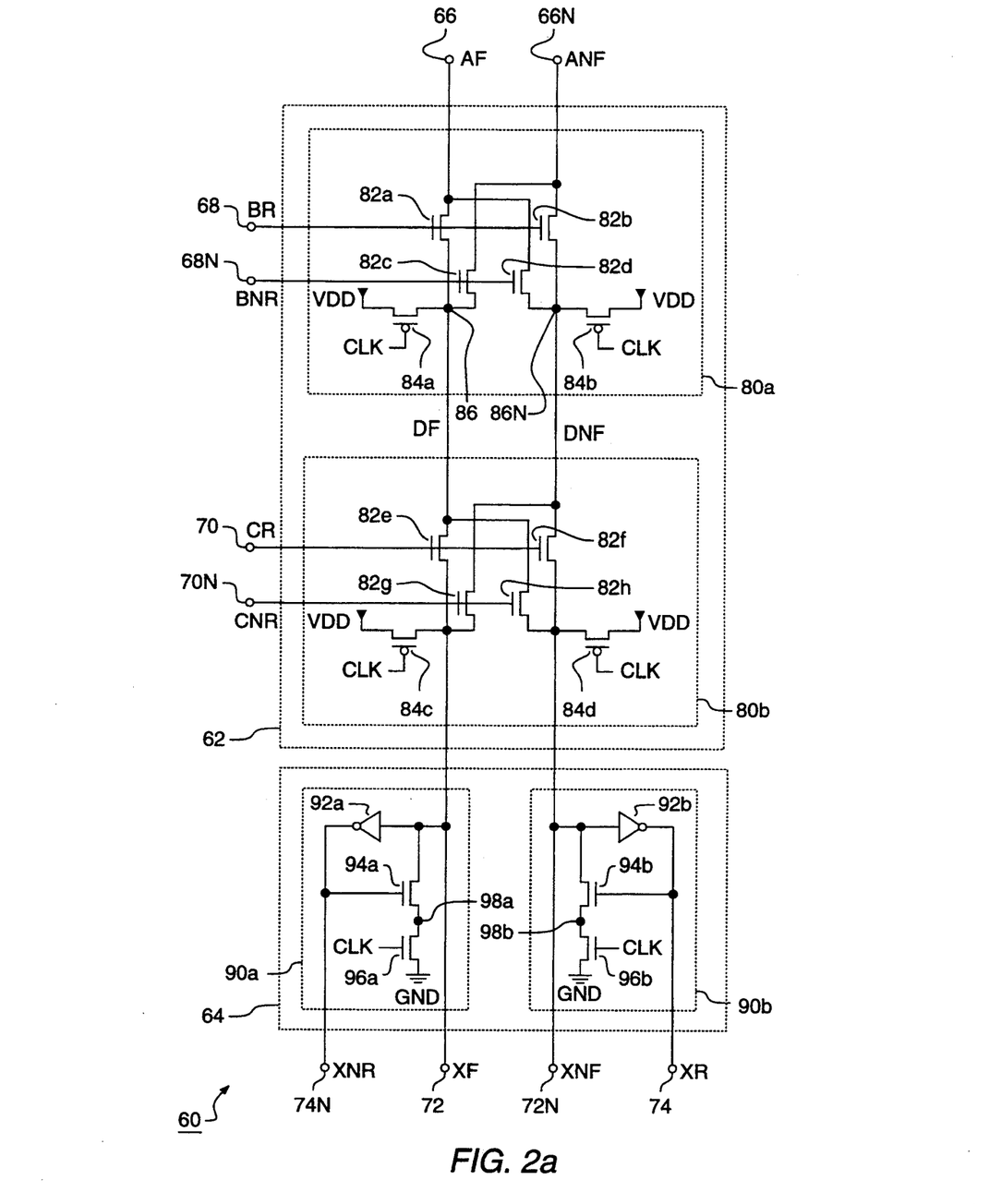
FIG. 2a shows the schematic of a preferred embodiment of a dynamic complementary pass transistor logic circuit according to the present invention. The circuit depicted in FIG. 2a implements the function Y=A EXOR B EXOR C.
Figure 2B:
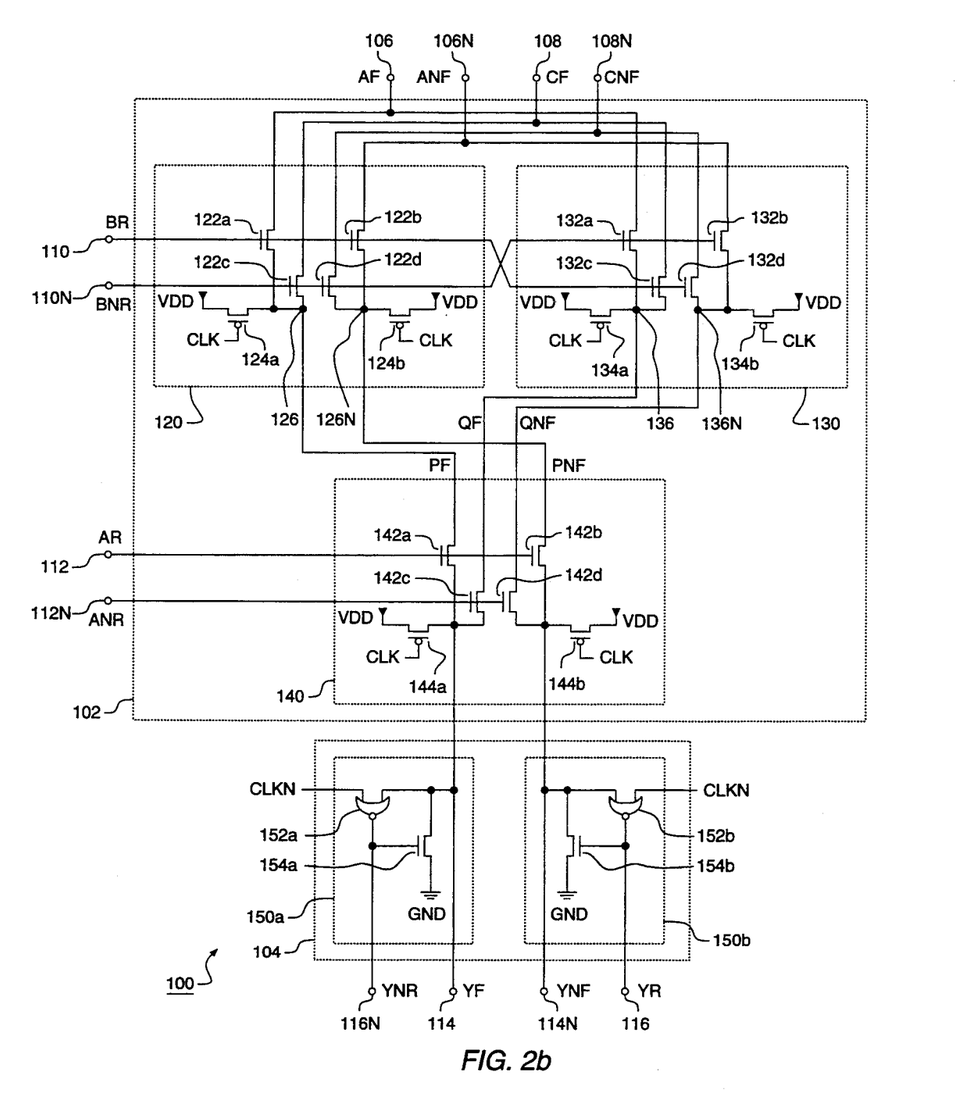
FIG. 2b shows the schematic of another preferred embodiment of a dynamic complementary pass transistor logic circuit according to the present invention. The circuit depicted in FIG. 2b implements the function Y=(A AND B) OR (A AND C) OR (B AND C).

FIGS. 2a and 2b depict schematics of preferred embodiments according to the present invention.

FIG. 2a shows a dynamic complementary pass transistor logic circuit 60, having a precharged complementary pass transistor network 62, having a dynamic logic buffering circuit; 64, and having a positive supply voltage VDD, a ground node GND, and a clock CLK.

Precharged complementary pass transistor network 62 has two falling inputs 66 and 66N, also referred to as true and complementary falling inputs AF and ANF, or simply falling input pair AF and ANF. and four rising inputs, 68, 68N, 70 and 70N. Rising inputs 68 and 68N are also referred to as rising input pair BR and BNR, and rising inputs 70 and 70N are also referred to as rising input pair CR and CNR. Precharged complementary pass transistor network 62 has two falling outputs 72 and 72N, also referred to as falling output pair XF and XNF.

Dynamic logic buffering circuit 64 has connections to falling outputs 72 and 72N and has two rising outputs 74 and 74N, also referred to as rising output pair XR and XNR.

Precharged complementary pass transistor network 62 includes two precharged complementary pass transistor building blocks 80a and 80b and two intermediate nodes 86 and 86N. Building blocks 80a and 80b are chosen from embodiments 20, 26, 32, 38 shown in FIGS. 1a, 1c, 1e and 1g, respectively. Precharged complementary pass transistor network 62 may be composed of any combination of embodiments 20, 26, 32, 38 shown in FIGS. 1a, 1c, 1e and 1g, and of similar building blocks derived by the designer, in order to give precharged complementary pass transistor network 62 the desired logic functionality.

Building block 80a consists of four NMOS pass transistors 82a through 82d and two PMOS precharge transistors 84a and 84b. NMOS pass transistor 82a has its gate connected to rising input 68, a first current electrode connected to falling input 66, and a second current electrode connected to intermediate node 86. NMOS pass transistor 82b has its gate connected to rising input 68, a first current electrode connected to falling input 66N, and a second current electrode connected to intermediate node 86N. NMOS pass transistor 82c has its gate connected to rising input 68N, a first current electrode connected to falling input 66N, and a second current electrode connected to intermediate node 86. NMOS pass transistor 82d has its gate connected to rising input 68N, a first current electrode connected to falling input 66, and a second current electrode connected to intermediate node 86N. PMOS precharge transistor 84a has its gate connected to clock CLK, has a first current electrode connected to positive supply voltage VDD, and has a second current electrode connected to intermediate node 86. PMOS precharge transistor 84b has its gate connected to clock CLK, has a first current electrode connected to positive supply voltage VDD, and has a second current electrode connected to intermediate node 86N.

Building block 80b consists of four NMOS pass transistors 82e through 82h and two PMOS precharge transistors 84c and 84d. NMOS pass transistor 82e has its gate connected to rising input 70, a first current electrode connected to intermediate node 86, and a second current electrode connected to falling output 72. NMOS pass transistor 82f has its gate connected to rising input 70, a first current electrode connected to intermediate node 86N, and a second current electrode connected to falling output 72N. NMOS pass transistor 82g has its gate connected to rising 70N, a first current electrode connected to intermediate node 86N, and a second current electrode connected to falling output 72. NMOS pass transistor 82h has its gate connected to rising input 70N, a first current electrode connected to intermediate node 86, and a second current electrode connected to falling output 72N. PMOS precharge transistor 84c has its gate connected to clock CLK, has a first current electrode connected to positive supply voltage VDD, and has a second current electrode connected to falling output 72. PMOS precharge transistor 84d has its gate connected to clock CLK, has a first current electrode connected to positive supply voltage VDD, and has a second current electrode connected to falling output 72N.

Dynamic logic buffering circuit 64 includes two evaluation speed-up circuits 90a and 90b. In the embodiment shown in FIG. 2a, evaluation circuit 90a contains an inverter 92a, two NMOS pull-down transistors 94a and 96a, and an intermediate node 98a. Inverter 92a has its input connected to falling output 72 and has its output connected to rising output 74N. NMOS pull-down transistor 94a has its gate connected to rising output 74N, has a first current electrode connected to falling output 72, and has a second current electrode connected to intermediate node 98a. NMOS pull-down transistor 96a has its gate connected to clock CLK, has a first current electrode connected to intermediate node 98a, and has a second current electrode connected to ground node GND. In the embodiment shown in FIG. 2a, evaluation circuit 90b contains an inverter 92b, two NMOS pull-down transistors 94b and 96b, and an intermediate node 98b. Inverter 92b has its input connected to falling output 72N and has its output connected to rising output 74. NMOS pull-down transistor 94b has its gate connected to rising output 74, has a first current electrode connected to falling output 72N, and has a second current electrode connected to intermediate node 98b. NMOS pull-down transistor 96b has its gate connected to clock CLK, has a first current electrode connected to intermediate node 98b, and has a second current electrode connected to ground node GND.

The operation of dynamic complementary pass transistor logic circuit 60 of FIG. 2a is as follows. Precharged complementary pass transistor building blocks 80a and 80b of FIG. 2a are both precharged NEXOR gates identical to embodiment 26 of FIG. 1c.

Falling inputs 66 and 66F, also referred to as falling input pair AF and ANF, are true and complementary falling signals derived from an equivalent static signal A. Similarly, rising inputs 68 and 68N, also referred to as rising input pair BR and BNR, are true and complementary rising signals derived from an equivalent static signal B. Rising inputs 70 and 70N, also referred to as rising input pair CR and CNR, are true and complementary rising signals derived from an equivalent static signal C. In view of earlier explanations, it is clear to those of ordinary skill in the art that intermediate nodes 86 and 86N, also referred to as falling node pair DF and DNF, can be related to an equivalent static signal D which obeys the following function:

$$D = A \text{ NEXOR } B \qquad \text{Eq. 12}$$

Similarly, falling outputs 72 and 72N, also referred to as falling output pair XF and XNF, are true and complementary falling signals which can be related to an equivalent static signal X. Equivalent static signal X obeys the following function:

$$X = D \text{ NEXOR } C \qquad \text{Eq. 13}$$

Hence, the logic functionality of precharged complementary pass transistor network 62, expressed in equivalent static signals, is:

$$X = (A \text{ NEXOR } B) \text{ NEXOR } C \qquad \text{Eq. 14a}$$

Which may also be written as:

$$X = A \text{ EXOR } B \text{ EXOR } C \qquad \text{Eq. 14b}$$

During an evaluation clock phase, one of falling outputs 72 and 72N is forced to a low logic level through precharged complementary pass transistor network 62, while the other one maintains a high logic level, according to the function X = A EXOR B EXOR C, where the inputs AF, ANF, BR, BNR, CR and CNR and the outputs XF and XNF, are related to A, B, C, and X as explained above.

During a precharge clock phase, a low logic level appears on clock CLK, and consequently, PMOS transistors 84a, 84b, 84c and 84d are turned on. Also, rising inputs BR and BNR and rising inputs CR and CNR are forced to a low logic level conform with the definition of rising inputs, and hence NMOS transistors 82a through 82h are turned off; and falling inputs AF and ANF are forced to a high logic level, conform with the definition of falling inputs. Furthermore, since a low logic level is present on clock CLK, both NMOS transistors 96a and 96b are turned off. As a result, evaluation speed-up circuit 90a does not contain a pull-down path between falling output 72 and ground node GND. Also, evaluation speed-up circuit 90b does not contain a pull-down path between falling output 72N and ground node GND. During a precharge phase, evaluation speed-up circuits 90a and 90b do not interfere with the precharging of falling outputs 72 and 72N to a high logic level by precharge PMOS transistors 84c and 84d. Hence, during a precharge clock phase, intermediate nodes 86 and 86N and falling outputs 72 and 72N are precharged to a high logic level.

During a precharge clock phase, a low level appears on clock CLK and hence both NMOS transistors 96a and 96b are turned off. During the precharge clock phase, a high logic level is established on falling outputs 72 and 72N, and through inverters 92a and 92b, respectively, a low level is established on rising outputs 74N and 74, respectively. Both NMOS transistors 94a and 94b are turned off. The exact potential of intermediate nodes 98a and 98b depends on the electric charge they carry, but this is not essential to the operation of precharged complementary pass transistor logic circuit 60.

It is now shown that evaluation speed-up circuits 90a and 90b of dynamic logic buffering circuit 64 do not interfere with the logic functionality realized by precharged complementary pass transistor network 62 on falling outputs 72 and 72N. Evaluation speed-up circuits 90a and 90b only perform a signal enhancement.

Indeed, an evaluation clock phase starts when a high logic level appears on clock CLK. Both NMOS transistors 96a and 96b are then turned on. Initially, due to capacitive storage on falling outputs 72 and 72N after being precharged, and due to the time required for a high-to-low transition to propagate through precharged complementary pass transistor logic network 62, a high logic level is present on both falling outputs 72 and 72N. Accordingly, a low logic level is initially present at both outputs of inverters 92a and 92b, appearing on rising outputs 74N and 74, respectively. Thus, both NMOS transistors 94a and 94b are turned off during the initial part of an evaluation clock phase. Hence, during the initial part of an evaluation clock phase, evaluation speed-up circuit 90a does not contain a pull-down path between falling output 72 and ground node GND, and evaluation speed-up circuit 90b does not contain a pull-down path between falling output 72N and ground node GND. The logic level on falling outputs 72 and 72N can only be changed by a high-to-low transitions that is forced on falling outputs 72 and 72N by a pull-down path through precharged complementary pass transistor logic network 62.

It was explained earlier that precharged complementary pass transistor logic network 62 implements a function X=A EXOR B EXOR C, where each of the variables is represent by dynamic logic, true and complementary, falling or rising signals. It was also explained earlier that due to the design of precharged complementary pass transistor logic network 62, it is ensured that one of falling outputs 72 and 72N is forced to make a high-to-low transition during an evaluation clock phase, while the other remains at a high logic level.

Assume now that falling output 72 is forced to make a high-to-low transition while falling output 72N remains high during a particular evaluation clock phase. As soon as the logic level on falling output 72 goes to a level below the trip point or gate threshold voltage of inverter 92a, a high logic level appears at the output of inverter 92a, and consequently at rising output 74N. At this moment, NMOS transistor 94a is turned on. Since this occurs during an evaluation clock phase, a high logic level is present on clock CLK and NMOS transistor 96a is turned on. Hence, an electrically conductive path appears between falling output 72 and ground node GND through NMOS transistors 96a and 94a, and falling output 72 is actively pulled down by evaluation speed-up circuit 90a. Hence, the high-to-low transition that was initiated through precharged complementary pass transistor logic network 62 is now accelerated by evaluation speed-up circuit 90a.

The signals appearing on falling outputs 72 and 72N have the characteristics of true and complementary falling signals, derived from an equivalent static signal X. The high-to-low transition of falling output 72 is enforced by evaluation speed-up circuit 90a, and may be used to drive a falling input of another circuit stage in the same circuit style. Falling output 72N may be used as the complementary falling signal of falling output 72, since it maintains a high logic level.

The signals appearing on rising outputs 74 and 74N have the characteristics of true and complementary rising signals, also derived from equivalent static signal X. Indeed, at the initial part of an evaluation clock phase, since both falling outputs 72 and 72N are precharged high, a low logic level appears at the outputs of inverters 92a and 92b, on both rising outputs 74N and 74, respectively. Assume still that falling output 72 is forced low through precharged pass transistor logic network 62. When the logic level on falling output 72 is forced below the trip point of inverter 92a, The signal on rising output 74N rises to a high logic level. This is accelerated and stored for the rest of this evaluation clock phase due to the regenerative feedback loop through NMOS transistor 94a. Meanwhile, falling output 72N maintains a high logic level, and consequently the output of inverter 92b, appearing on rising output 74, maintains a low logic level. Hence, rising outputs 74 and 74N are low during a precharge clock phase, and one of rising outputs 74 and 74N makes a low-to-high transition during an evaluation clock phase, while the other one maintains a low logic level. Hence, the signals on rising outputs 74 and 74N, also referred to as rising output pair XR and XNR, have the characteristics of a pair of true and complemenary rising signals and may be related to equivalent static signal X, to which also falling output pair XF and XNF have been related to. Since both rising outputs 74 and 74N are the outputs of inverters 92b and 92a, respectively, and hence are buffered signals, they may be readily used as true and complement rising signals to a rising input of a circuit stage in the same circuit style.

The case for which it is falling output 72N that is forced to make a high-to-low transition during a particular evaluation clock phase, while falling output 72 maintains a high level, is complementary to the case that was described above.

FIG. 2b shows a dynamic complementary pass transistor logic circuit 100, having a precharged complementary pass transistor network 102, having a dynamic logic buffering circuit 104, and having a positive supply voltage VDD, a ground node GND, a clock CLK, and an inverted clock CLKN.

Precharged complementary pass transistor network 102 has two falling inputs 106 and 106N, also referred to as true and complementary falling inputs AF and ANF, or simply falling input pair AF and ANF; two falling inputs 108 and 108N, also referred to as falling input pair CF and CNF; two rising inputs 110 and 110N, also referred to as rising input pair BR and BNR; and two rising inputs, 112 and 112N, also referred to as rising input pair AR and ANR; Precharged complementary pass transistor network 102 has two falling outputs 114 and 114N, also referred to as falling output pair YF and YNF.

Dynamic logic buffering circuit 104 has connections to falling outputs 114 and 114N and has two rising outputs 116 and 116N, also referred to as rising output pair YR and YNR.

Precharged complementary pass transistor network 102 further includes three precharged complementary pass transistor building blocks 120, 130 and 140 and four intermediate nodes 126, 126N, 136 and 136N. Building blocks 120, 130 and 140 are chosen from embodiments 20, 26, 32, and 38 of FIGS. 1a, 1c, 1e, and 1g, respectively. Again, precharged complementary pass transistor network 102 may be composed of any combination of embodiments 20, 26, 32, and 38 of FIGS. 1a, 1c, 1e, and 1g, respectively, and of building blocks derived by the designer, in order to give precharged complementary pass transistor network 102 the desired logic functionality.

Building block 120 consists of four NMOS pass transistors 122a through 122d and two PMOS precharge transistors 124a and 124b. NMOS pass transistor 122a has its gate connected to rising input 110, a first current electrode connected to falling input :106, and a second current electrode connected to intermediate node 126. NMOS pass transistor 122b has its gate connected to rising input 110, a first current electrode connected to falling input 106N, and a second current electrode connected to intermediate node 126N. NMOS pass transistor 122c has its gate connected to rising input 110N, a first current electrode connected to falling input 108, and a second current electrode connected to intermediate node 126. NMOS pass transistor 122d has its gate connected to rising input 110N, a first current electrode connected to falling input 108N, and a second current electrode connected to intermediate node 126N. PMOS precharge transistor 124a has its gate connected to clock CLK, has a first current electrode connected to positive supply voltage VDD, and has a second current electrode connected to intermediate node 126. PMOS precharge transistor 124b has its gate connected to clock CLK, has a first current electrode connected to positive supply voltage VDD, and has a second current electrode connected to intermediate node 126N. The signals on intermediate nodes 126 and 126N are also referred to as true and complementary falling signal pair PF and PNF.

Building block 130 consists of four NMOS pass transistors 132a through 132d and two PMOS precharge transistors 134a and 134b. NMOS pass transistor 132a has its gate connected to rising input 110N, a first current electrode connected to falling input 106, and a second current electrode connected to intermediate node 136. NMOS pass transistor 132b has its gate connected to rising input 110N, a first current electrode connected to falling input 106N, and a second current electrode connected to intermediate node 136N. NMOS pass transistor 132c has its gate connected to rising input 110, a first current electrode connected to falling input 108, and a second current electrode connected to intermediate node 136. NMOS pass transistor 132d has its gate connected to rising input 110, a first current electrode connected to falling input 108N, and a second current electrode connected to intermediate node 136N. PMOS precharge transistor 134a has its gate connected to clock CLK, has a first current electrode connected to positive supply voltage VDD, and has a second current electrode connected to intermediate node 136. PMOS precharge transistor 134b has its gate connected to clock CLK, has a first current electrode connected to positive supply voltage VDD, and has a second current electrode connected to intermediate node 136N. The signals on intermediate nodes 136 and 136N are also referred to as true and complementary falling signal pair QF and QNF.

Building block 140 consists of four NMOS pass transistors 142a through 142d and two PMOS precharge transistors 144a and 144b. NMOS pass transistor 142a has its gate connected to rising input 112, a first current electrode connected to falling input 126, and a second current electrode connected to intermediate node 114. NMOS pass transistor 142b has its gate connected to rising input 112, a first current electrode connected to falling input 126N, and a second current electrode connected to intermediate node 114N. NMOS pass transistor 142c has its gate connected to rising input 112N, a first current electrode connected to falling input 136, and a second current electrode connected to intermediate node 114. NMOS pass transistor 142d has its gate connected to rising input 112N, a first current electrode connected to falling input 136N, and a second current electrode connected to intermediate node 114N. PMOS precharge transistor 144a has its gate connected to clock CLK, has a first current electrode connected to positive supply voltage VDD, and has a second current electrode connected to intermediate node 114. PMOS precharge transistor 144b has its gate connected to clock CLK, has a first current electrode connected to positive supply voltage VDD, and has a second current electrode connected to intermediate node 114N.

Dynamic logic buffering circuit 104 includes two evaluation speed-up circuits 150a and 150b. In the embodiment shown in FIG. 2b, evaluation circuit 150a contains a two-input logic NOR gate 152a and an NMOS pull-down transistor 154a. Two-input logic NOR gate 152a has a first input connected to inverted clock CLKN, has a second input connected to falling output 114, and has its output connected to rising output 116N. NMOS pull-down transistor 154a has its gate connected to rising output 116N, has a first current electrode connected to falling output 114, and has a second current electrode connected to ground node GND. In the embodiment shown in FIG. 2b, evaluation circuit 150b contains a two-input logic NOR gate 152b and an NMOS pull-down transistor 154b. Two-input logic NOR gate 152b has a first input connected to inverted clock CLKN, has a second input connected to falling output 114N, and has its output connected to rising output 116. NMOS pull-down transistor 154b has its gate connected to rising output 116, has a first current electrode connected to falling output 114N, and has a second current electrode connected to ground node GND.

The operation of dynamic complementary pass transistor logic circuit 100 of FIG. 2b is as follows. Precharged complementary pass transistor building blocks 120, 130 and 140 of FIG. 2b are all precharged multiplexer gates identical to embodiment 20 of FIG. 1a.

Falling inputs 106 and 106F, also referred to as falling input pair AF and ANF, are true and complement falling signals derived from an originating signal A. Similarly, falling inputs 108 and 108N, also referred to as falling input pair CF and CNF, are true and complement rising signals derived from an originating signal C. Rising inputs 110 and 110N, also referred to as rising input pair BR and BNR, are true and complement rising signals derived from an originating signal B. Rising inputs 112 and 112N, also referred to as rising input pair AR and ANR, are true and complement rising signals also derived from originating signal A. Falling outputs 114 and 114N, also referred to as falling output pair YF and YNF, are true and complement falling signals which can be related to an originating signal Y. Intermediate nodes 126 and 126N, also referred to as falling signal pair PF and PNF can be related to an equivalent static signal P. Intermediate nodes 136 and 136N, also referred to as falling signal pair QF and QNF can be related to an equivalent static signal Q.

During a precharge clock phase, a low logic level appears on clock CLK, and consequently, PMOS transistors 124a, 124b, 134a, 134b, 144a and 144b are turned on. Also, rising inputs BR and BNR and rising inputs AR and ANR are forced to a low logic level, conform with the definition of rising inputs, and hence NMOS transistors 122a through 122d, 132a through 132d, and 142a through 142d are turned off. Falling inputs AF, ANF, CF and CNF are forced to a high logic level, conform with the definition of falling inputs. Furthermore, since a high logic level is present on inverted clock CLKN, the outputs of logic NOR gates 152a and 152b are at a low logic level, appearing on rising outputs 116N and 116, respectively. As a result, both NMOS transistors 154a and 154b are turned off, and hence evaluation speed-up circuit 150a does not contain a pull-down path between falling output 114 and ground node GND. Also, evaluation speed-up circuit 150b does not contain a pull-down path between falling output 114N and ground node GND. Hence, during a precharge clock phase, evaluation speed-up circuits 150a and 150b do not interfere with the precharging of falling output nodes 114 and 114N to a high logic level by precharge PMOS transistors 144a and 144b. During a precharge clock phase, intermediate nodes 126, 126N, 136 and 136N, and falling output nodes 114 and 114N are precharged to a high logic level.

Building blocks 120, 130 and 140 of FIG. 2b implement a 2-to-1 multiplexer similar to embodiment 20 of FIG. 1a, having different input and output variables. Now referring back to FIG. 2b, in view of earlier explanations, the logic functionality of building block 120, expressed using equivalent static signals, can be written as:

$$P = B.A + B'.C \qquad \text{Eq. 15}$$

Similarly, the logic functionality of building block 130, expressed using equivalent static signals, can be written as:

$$Q = B.C + B'.A \qquad \text{Eq. 16}$$

The logic functionality of building block 140, expressed using equivalent static signals, can be written as:

$$Y = A.P + A'.Q \qquad \text{Eq. 17}$$

After substitution of Eq. 15 and Eq. 16 into Eq. 17, this yields:

$$Y = A.(B.A + B'.C) + A'.(B.C + B'.A) \qquad \text{Eq. 18}$$

And, since A.A = A:

$$Y = A.B + A.B'.C + A'.B.C + A'.B'.A \qquad \text{Eq. 19}$$

Since A'.A = 0:

$$Y = A.B + C.(A.B' + A'.B) \qquad \text{Eq. 20}$$

Since A.B = A.B + A.B.C + A.B.C = A.B + C.(A.B + A.B):

$$Y = A.B + C.(A.B' + A.B + A.B + A'.B) \qquad \text{Eq. 21}$$

Since A.B' + A.B = A and A.B + A'.B = B:

$$Y = A.B + C.(A + B) \qquad \text{Eq. 22}$$

Which can be rewritten as:

$$Y = A.B + A.C + B.C \qquad \text{Eq. 23}$$

This is the implementation of:

$$Y = (A \text{ AND } B) \text{ OR } (A \text{ AND } C) \text{ OR } (B \text{ AND } C) \qquad \text{Eq. 24}$$

During a precharge clock phase, a high level appears on inverted clock CLKN and hence a low logic level appears at the outputs of both logic NOR gates 152a and 152b, on rising outputs 116N and 116, respectively. Meanwhile, a high logic level appears on falling outputs 114 and 114N due to precharging through PMOS transistors 144a and 144b.

It is now shown that evaluation speed-up circuits 150a and 150b of dynamic logic buffering circuit 104 do not interfere with the logic functionality realized by precharged complementary pass transistor network 102 on falling outputs 114 and 114N. Evaluation speed-up circuits 150a and 150b only perform a signal enhancement.

Indeed, an evaluation clock phase starts when a high logic level appears on clock CLK, and a low logic level appears on inverted clock CLKN. Both logic NOR gates 152a and 152b then act as inverters with falling outputs 114 and 114N as their inputs, respectively. Initially, due to capactive storage on falling outputs 114 and 114N after being precharged, and due to the time required for a high-to-low transition to propagate through precharged complementary pass transistor logic network 102, a high logic level is present on both falling outputs 114 and 114N. Accordingly, a low logic level is initially present at both rising outputs 116N and 116 of logic NOR gates 152a and 152b, respectively. Thus, both NMOS transistors 154a and 154b are turned off during the initial part of an evaluation clock phase. Hence, during the initial part of an evaluation clock phase, evaluation speed-up circuit 150a does not contain a pull-down path between falling output 114 and ground node GND, and evaluation speed-up circuit 150b does not contain a pull-down path between falling output 114 and ground node GND. The logic level on falling outputs 114 and 114N can only be changed by a high-to-low transition that is forced on one of falling outputs 114 and 114N through precharged complementary pass transistor logic network 102.

It was explained earlier that precharged complementary pass transistor logic network 102 implements a function Y = (A AND B) OR (A AND C) OR (B AND C), where each of the variables is represent by dynamic logic, true and complementary, rising or falling signals. It was also explained earlier that due to the connections in precharged complementary pass transistor logic network 102, it is ensured that one of falling outputs 114 and 114N is forced to make a high-to-low transition during an evaluation clock phase, while the other remains at a high logic level.

Assume now that falling output 114 is forced to make a high-to-low transition while falling output 114N remains high during a particular evaluation clock phase. As soon as the logic level on falling output 114 goes to a level below the gate threshold voltage of logic NOR gate 152a, a high logic level appears at the output of logic NOR gate 152a, at rising output 116N. At this moment, NMOS transistor 154a is turned on. Hence, an electrically conductive path appears between falling output 114 and ground node GND through NMOS transistor 154a, and falling output 114 is actively pulled down by evaluation speed-up circuit 150a. Hence, the high-to-low transition that was initiated by a pull-down path through precharged complementary pass transistor logic network 102 is now locally accelerated by evaluation speed-up circuit 150a.

The signals appearing on falling outputs 114 and 114N have the characteristics of true and complementary falling signals. The high-to-low transition of falling output 114 is enforced by evaluation speed-up circuit 150a, and may be used to drive a falling input of another circuit stage in the same circuit style. Falling output 114N may be used as the complementary falling signal of falling output 114, since it maintains a high logic level.

The signals appearing on rising outputs 116 and 116N have the characteristics of true and complement rising signals. Indeed, at the initial part of an evaluation phase, since both falling outputs 114 and 114N are precharged high, a low logic level appears at the outputs of logic NOR gates 152a and 152b, on both rising outputs 116N and 116, respectively. Assume still that falling output 114 is forced low by a pull-down path through precharged complementary pass transistor logic network 102. During the evaluation clock phase, a low logic level is present on inverted clock CLKN and both logic NOR gates 152a and 152b then act as inverters with falling outputs 114 and 114N as their inputs, respectively. When the logic level on falling output 114 is forced below the gate threshold voltage of logic NOR gate 152a, the signal on rising output 116N rises to a high logic level. This is accelerated and stored for the rest of this evaluation clock phase due to the regenerative feedback loop through NMOS transistor 154a. Meanwhile, falling output 114N maintains a high logic level, and consequently the output of logic NOR gate 152b, appearing on rising output 116, maintains a low logic level. Hence, rising outputs 116 and 116N are low during a precharge clock phase, and one of rising outputs 116 and 116N makes a low-to-high transition during an evaluation clock phase, while the other one maintains a low logic level. Hence, the signals on rising outputs 116 and 116N, also referred to as rising outputs YR and YNR, have the characteristics of a true and complementary rising signal pair and may be related to equivalent static signal Y, to which also falling outputs YF and YNF have been related to. Since both rising outputs 116 and 116N are the outputs of logic NOR gates 152b and 152a, respectively, and hence are buffered signals, they may be readily used as true and complementary rising signals to a rising input of a circuit stage in the same circuit style.

The case for which it is falling output 114N that is forced to make a high-to-low transition during a particular evaluation clock phase, while falling output 114 maintains a high level, is complementary to the case that was described above.

Figure 3:
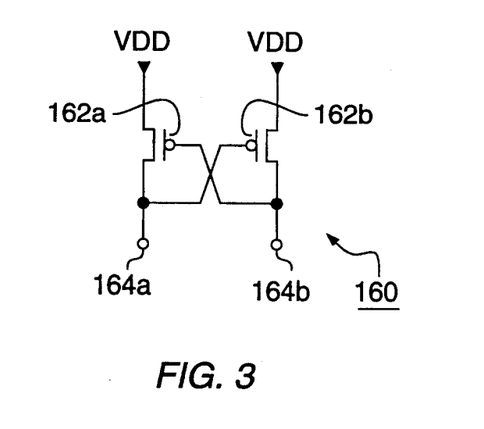
FIG. 3 shows the schematic of a noise immunity improvement circuit using cross-coupled PMOS transistors.

FIG. 3 shows a noise immunity enhancement circuit 160 having two cross-coupled PMOS transistors 162a and 162b. Noise immunity enhancement circuit 160 further contains a connection to a positive supply voltage VDD and two falling nodes 164a and 164b.

Cross-coupled PMOS transistor 162a has its gate connected to falling node 164b, has a first current electrode connected to positive supply voltage VDD and has a second current electrode connected to falling node 164a. Cross-coupled PMOS transistor 162b has its gate connected to falling node 164a, has a first current electrode connected to positive supply voltage VDD and has a second current electrode connected to falling node 164b.

Falling nodes 164a and 164b of noise immunity enhancement circuit 160 of FIG. 3 are intended for connection to falling output nodes 72 and 72N of dynamic complementary pass transistor logic circuit 60 of FIG. 2a, or to falling output nodes 114 and 114N of dynamic complementary pass transistor logic circuit 100 of FIG. 2b.

Now again referring to FIG. 3, assume that falling node 164a is discharged through circuitry not shown in FIG. 3, during an evaluation clock phase, then PMOS transistor 162b is turned on and ensures that a high logic level is maintained on falling node 164b, even in the presence of disturbances, such as capacitive coupling to switching nodes, or high-resistivity discharging paths between falling node 164b and a ground node GND.

The operation of the case for which falling node 164b is discharged and falling node 164a maintains a high logic level is complementary.

Embodiment 60 of FIG. 2a may be made quasi-static by connecting a PMOS pull-up transistor with small current driving capability between falling output 72 and VDD, with its gate connected to rising output 74N; and by connecting a PMOS pull-up transistor between falling output 72N and VDD, with its gate connected to rising output 74. This is explained in mentioned U.S. patent application Ser. No. 142,900. Similarly, embodiment 100 of FIG. 2b may be made quasi-static by connecting a PMOS pull-up transistor between falling output 114 and VDD, with its gate connected to rising output 116N; and by connecting a PMOS pull-up transistor between falling output 114N and VDD, with its gate connected to rising output 116. This is also explained in U.S. patent application Ser. No. 142,900.

It is clear to those of ordinary skill in the art that, when several logic functions are computed from the same inputs, it may be possible to share parts of the precharged complementary pass transistor logic networks in the generation of a plurality of complementary rising and falling output signal pairs. Circuits that use this strategy will be referred to as "Multiple Output Dynamic Complementary Pass transistor Logic".

Similarly to U.S. Patent Ser. No. 5,015,882, "COMPOUND DOMINO CMOS CIRCUIT" to T. W. Houston et al., it is possible to use multiple falling outputs of circuits according to the present invention as inputs to a static logic multi-input gate composed of AND and OR gates, with an optional final inverter.

It should be pointed out that in many cases the complementary pass transistor logic networks may be simplified. This is due to the fact that it is only necessary to a create a pull-down path, while in the conventional NMOS pass-transistor logic, both pull-down and pull-up paths are provided. For example, now referring back to FIG. 1e, NMOS pass transistor 34d of embodiment 32 is only turned on when rising input ENR goes high. However, this only occurs when falling input ENF stays high, in which case falling output ZNF stays high. Since falling output ZNF is already precharged high, it is safe to remove NMOS pass transistor 34d. Similarly, now referring to FIG. 1g, NMOS pass transistor 40c of embodiment 38 is only turned on when rising input ER goes high. However, this only occurs when falling input EF stays high, in which case falling output ZF stays high. Since falling output ZF is already precharged high, it is safe to remove NMOS pass transistor 40c.

It may be considered to remove some of the clocked PMOS precharge transistors on intermediate nodes in a precharged complementary pass transistor logic network. This results in occasional charge redistributions during an evaluation clock phase, similar to charge redistributions in the DOMINO CMOS technique, and the design must be such that these charge redistributions do not cause large voltage drops below the trip point of the evaluation speed-up circuit's inverter or logic NOR gate.

The signals on falling outputs 72 and 72N and intermediate nodes 86 and 86N of embodiment 60 in FIG. 2a; and the signals on falling outputs 114 and 114N and intermediate nodes 126, 126N, 136 and 136N of embodiment 100 in FIG. 2b; as well as all falling inputs, may be sent through a programmable interconnection architecture such as the one described in earlier mentioned U.S. patent application 142,900.

Additional inverters or buffers may be placed at falling outputs 72 and 72N or at rising output nodes 74N and 74 of embodiment 60 in FIG. 2a, or at falling outputs 114 and 114N or at rising output nodes 116N and 116 of embodiment 100 in FIG. 2b, in order to derive alternative rising and falling outputs. However, in that case, an extra propagation delay is incurred.

Evaluation speed-up circuits 90a and 90b of embodiment 60 in FIG. 2a and evaluation speed-up circuits 150a and 150b of embodiment 100 in FIG. 2b may each be replaced by a sequence of two static inverters, having their first input connected to falling output nodes 72 and 72N of embodiment 60 in FIG. 2a and falling output nodes 150a and 150b of embodiment 100 in FIG. 2b. The outputs of each of the first inverters in the sequence are then a buffered rising signal, while the outputs of each of the second inverters in the sequence are then a buffered falling signal.

It is also possible to construct programmable logic devices and look-up tables using the circuit techniques of the present invention.

The embodiments shown in FIGS. 2a and 2b use complementary MOS technology. However, the circuit principle may me implemented using any type of switching devices, more in particular, using exclusively NMOS, PMOS, bipolar, heterojunction bipolar, MESFET, HEMT or electro-optical switching devices, etc.; or combinations thereof.

It is obvious that the circuit style according to the present invention may be extended to be used with precharged complementary PMOS pass transistor logic networks, in which intermediate nodes are precharged to a low logic level. The signal transitions and the evaluation speed-up circuits must be complemented, meaning that the high level and the low level are exchanged. Mentioned patent application Ser. No. 142,900 explains how a complemented evaluation speed-up circuit is obtained. It is clear to those of ordinary skill in the art that as long as rising output pairs are used as inputs to rising input pairs, and falling output pairs are used as inputs to falling input pairs, dynamic complementary pass transistor logic with NMOS pass transistors and with PMOS pass transistors and complemented evaluation speed-up circuits can be used in combination.

What is claimed is:

1. In an integrated circuit, a dynamic logic circuit,
said dynamic: logic circuit comprising a supply node, a ground node, a clock node, first and second precharged switch networks, a plurality of first input nodes, a plurality of second input nodes, first and second evaluation speed-up circuits first and second output nodes, third and fourth output nodes, and having a precharge and an evaluation clock phase,
said precharge clock phase being characterized by a predetermined logic level being asserted on said clock node, said evaluation clock phase being characterized by said predetermined logic level not being asserted on said clock node,
each of said first input nodes having a rising signal, said rising signal being characterized as a signal that is at a low logic level at the beginning of said evaluation clock phase, and that may make at most one level change during said evaluation clock phase,
each of said second input nodes having a falling signal, said falling signal being characterized as a signal that is at a high logic level at the beginning of said evaluation clock phase, and that may make at most one level change during said evaluation clock phase,
said first precharged switch network providing means for establishing a first electrically conductive path between said first output node and one of said second input nodes during said evaluation clock phase whereby said first electrically conductive path is determined by said first input nodes, and providing means for precharging said first output node to a high logic level during said precharge clock phase,
said second precharged switch network providing means for establishing a second electrically conductive path between said second output node and one of said second input nodes during said evaluation clock phase whereby said second electrically conductive path is determined by said first input nodes, and providing means for precharging said second output node to a high logic level during said precharge clock phase,
said first and second evaluation speed-up circuits each having first and second terminals and a clock input, said first terminal of said first evaluation speed-up circuit being connected to said first output node, said second terminal of said first evaluation speed-up circuit being connected to said fourth output node, said first terminal of said second evaluation speed-up circuit being connected to said first output node, said second terminal of said second evaluation speed-up circuit being connected to said third output node,
said first and second evaluation speed-up circuits each providing means for detecting a deviation larger than a predetermined threshold from said high logic level towards said low logic level on said first terminal during said evaluation clock phase, providing means to discharge said first terminal to said low logic level after detection of said deviation, providing means to charge said second terminal to said high logic level after detection of said deviation, and providing means to discharge said second terminal to said low logic level during said precharge clock phase.

2. The dynamic logic circuit according to claim 1, wherein said first precharged switch network further comprises a plurality of first n-channel field effect transistors having their gates connected to some of said first input nodes, said first n-channel field effect transistors having at least some current electrodes connected to said second input nodes, said first n-channel field effect transistors having at least some current electrodes connected to said first output node, said first n-channel field effect transistors providing means for discharging said first output node according to a first logic function of said first and second input nodes, and said first precharged switch network comprising means for precharging some of said current electrodes of said first n-channel field effect transistors, and wherein said second precharged switch network further comprises a plurality of second n-channel field effect transistors having their gates connected to some of said first input nodes, said second n-channel field effect transistors having at least some current electrodes connected to said second input nodes, said second n-channel field effect transistors having at least some current electrodes connected to said second output node, said second n-channel field effect transistors providing means for discharging said second output node according to a second logic function of said first and second input nodes, whereby said second logic function is the logic complement of said first logic function, and said first precharged switch network comprising means for precharging some of said current electrodes of said second n-channel field effect transistors.

3. The dynamic logic circuit in accordance with claim 1, wherein at least one of said first and second evaluation speed-up circuits comprises an inverter, having an input connected to said first terminal and having an output connected to said second terminal, and first and second pull-down n-channel field effect transistors, said first pull-down n-channel field effect transistor having a first current electrode connected to said first terminal, having a second current electrode connected to an intermediate node, and having a gate connected to said second terminal, said second pull-down n-channel field effect transistor having a first current electrode connected to said intermediate node, having a second current electrode connected to said ground node, and having a gate connected to said clock input.

4. The dynamic logic circuit in accordance with claim 1, wherein at least one of said first and second evaluation speed-up circuits comprises a two-input logic NOR gate, having a first input connected to said first terminal, having a second input connected to said clock input, and having an output connected to said second terminal, a first pull-down n-channel field effect transistor, said first pull-down n-channel field effect transistor having a first current electrode connected to said first terminal, having a second current electrode connected to said ground node, and having a gate connected to said second terminal.

5. In an integrated circuit, a dynamic logic circuit, said dynamic logic circuit comprising a supply node, a ground node, a clock node, first and second precharged switch networks, a plurality of first input nodes, a plurality of second input nodes, first and second evaluation speed-up circuits, first and second output nodes, third and fourth output nodes, and having a precharge and an evaluation clock phase, said precharge clock phase being characterized by a predetermined logic level being asserted on said clock node, said evaluation clock phase being characterized by said predetermined logic level not being asserted on said clock node, each of said first input nodes having a falling signal, said falling signal being characterized as a signal that is at a high logic level at the beginning of said evaluation clock phase, and that may make at most one level change during said evaluation clock phase, each of said second input nodes having a rising signal, said rising signal being characterized as a signal that is at a low logic level at the beginning of said evaluation clock phase, and that may make at most one level change during said evaluation clock phase, said first precharged switch network providing means for establishing a first electrically conductive path between said first output node and one of said second input nodes during said evaluation clock phase whereby said first electrically conductive path is determined by said first input nodes, and providing means for precharging said first output node to a low logic level during said precharge clock phase, said second precharged switch network providing means for establishing a second electrically conductive path between said second output node and one of said second input nodes during said evaluation clock phase whereby said second electrically conductive path is determined by said first input nodes, and providing means for precharging said second output node to a low logic level during said precharge clock phase, said first and second evaluation speed-up circuits each having first and second terminals and a clock input, said first terminal of said first evaluation speed-up circuit being connected to said first output node, said second terminal of said first evaluation speed-up circuit being connected to said fourth output node, said first terminal of said second evaluation speed-up circuit being connected to said first output node, said second terminal of said second evaluation speed-up circuit being connected to said third output node, said first and second evaluation speed-up circuits each providing means for detecting a deviation larger than a predetermined threshold from said low logic level towards said high logic level on said first terminal during said evaluation clock phase, providing means to scharge said first terminal to said high logic level after detection of said deviation, providing means to discharge said second terminal to said low logic level after detection of said deviation, and providing means to charge said second terminal to said high logic level during said precharge clock phase.

* * * * *